United States Patent
Chi et al.

(10) Patent No.: US 12,341,140 B2
(45) Date of Patent: Jun. 24, 2025

(54) DISPLAY PANEL AND DISPLAY DEVICE

(71) Applicant: Shanghai Tianma Micro-Electronics Co., Ltd., Shanghai (CN)

(72) Inventors: Xiao Chi, Shanghai (CN); Jujian Fu, Shanghai (CN); Ping An, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 750 days.

(21) Appl. No.: 17/512,689

(22) Filed: Oct. 28, 2021

(65) Prior Publication Data

US 2022/0052034 A1    Feb. 17, 2022

(30) Foreign Application Priority Data

Feb. 4, 2021  (CN) .......................... 202110157343.9
Mar. 2, 2021  (CN) .......................... 202110231403.7

(51) Int. Cl.
*H01L 25/16* (2023.01)
*H10D 86/40* (2025.01)
(Continued)

(52) U.S. Cl.
CPC ......... *H01L 25/167* (2013.01); *H10D 86/441* (2025.01); *H10D 86/60* (2025.01); *H10H 20/856* (2025.01); *H10H 20/857* (2025.01)

(58) Field of Classification Search
CPC ..... H01L 33/58; H01L 33/60; H01L 25/0753; H01L 25/167; H01L 27/1225;
(Continued)

(56) References Cited

U.S. PATENT DOCUMENTS

2018/0122836 A1\*  5/2018  Kang ................... H10D 86/441
2019/0115370 A1\*  4/2019  Fu ........................... H10D 86/60
(Continued)

FOREIGN PATENT DOCUMENTS

CN          108022940 A       5/2018

*Primary Examiner* — Mark W Tornow
*Assistant Examiner* — Priya M Rampersaud
(74) *Attorney, Agent, or Firm* — KILPATRICK TOWNSEND & STOCKTON LLP

(57) ABSTRACT

Provided are display panel and display device. Display panel includes base substrate; light-emitting element located on base substrate; first electrode and second electrode both electrically connected to light-emitting element, both located on side of light-emitting element facing base substrate or on side of light-emitting element facing away from base substrate and both providing voltage signals for light-emitting element; first reflective layer located on side of light-emitting element facing base substrate, and with direction perpendicular to base substrate as projection direction, first reflective layer covering light-emitting element; and voltage signal line located on side of light-emitting element facing base substrate. First electrode and second electrode respectively include first extension part and second extension part, at least one of which is connected to voltage signal line and does not overlap first reflective layer. First electrode and second electrode normally receive voltage signals, and light-emitting efficiency of display panel is improved.

12 Claims, 13 Drawing Sheets

(51) Int. Cl.
 *H10D 86/60* (2025.01)
 *H10H 20/856* (2025.01)
 *H10H 20/857* (2025.01)

(58) Field of Classification Search
 CPC ..... H01L 27/124; H01L 33/62; H01L 27/156; H01L 33/46; H01L 27/1214; H01L 33/387; H01L 33/18; H01L 33/405; H10K 59/131; H10K 59/1213; H10K 59/123; H10K 50/856; G09G 2300/0426; G09G 3/32; G02F 1/133553
 See application file for complete search history.

(56) References Cited

U.S. PATENT DOCUMENTS

2020/0135971 A1\* 4/2020 Beak ................... H10K 59/173
2020/0168777 A1\* 5/2020 Kang .................. H10H 29/142

\* cited by examiner

DISPLAY PANEL AND DISPLAY DEVICE

CROSS-REFERENCE TO RELATED APPLICATION(S)

This application claims priority to Chinese Patent Application No. 202110231403.7, titled "DISPLAY PANEL AND DISPLAY DEVICE" filed Mar. 2, 2021, which claims priority to the Chinese Patent Application No. 202110157343.9, titled "DISPLAY PANEL AND ELECTRICAL DEVICE" filed Feb. 4, 2021, the disclosures of the two are incorporated herein by reference in their entireties.

FIELD

The present disclosure relates to the field of display technologies and, in particular, to a display panel and a display device including the display panel.

BACKGROUND

In recent years, the display industry has entered a stage of rapid development. The display panel have gradually developed from a liquid crystal display panel to a self-luminous light-emitting panel such as an organic light-emitting display panel and a micro light-emitting diode (micro LED) display panel. The self-luminous light-emitting panel has many advantages such as a simple structure, a high light-emitting efficiency, flexibility, and lightness and thinness and thus is widely favored by consumers. In particular, since the light-emitting element of the micro LED display panel is the micro LED and has advantages such as relatively high light-emitting brightness and relatively low power consumption, the micro LED display panel has gradually become a hotspot in the industry.

Since the micro LED emits light uniformly in all directions, to achieve high brightness of the display panel, a special design is needed to focus the light emitted by the micro LED toward a light-emitting side of the display panel, to increase the light-emitting efficiency of the display panel as much as possible. Based on this, how to arrange a reasonable structure to increase the light-emitting efficiency of the display panel while the normal function of the display panel is ensured is a problem to be solved urgently in the field.

SUMMARY

In view of the above, the present application provides a display panel and a display device, to increase the light-emitting efficiency of the display panel while ensuring the normal function of the display panel, by arranging a reasonable reflection structure.

In an aspect, embodiments of the present application provide a display panel. The display panel includes a base substrate, a light-emitting element, a first electrode and a second electrode, a first reflective layer, and a voltage signal line. The light-emitting element is located on the base substrate. The first electrode and the second electrode are electrically connected to the light-emitting element, are both located on a side of the light-emitting element facing the base substrate or both located on a side of the light-emitting element facing away from the base substrate, and provide voltage signals for the light-emitting element. The first reflective layer is located on a side of the light-emitting element facing the base substrate, and with a direction perpendicular to the base substrate as a projection direction, the first reflective layer covers the light-emitting element. The voltage signal line is located on a side of the light-emitting element facing the base substrate. The first electrode includes a first extension part, and the second electrode includes a second extension part. The first extension part and/or the second extension part are connected to the voltage signal line. With the direction perpendicular to the base substrate as the projection direction, at least one of the first extension part or the second extension part does not overlap the first reflective layer.

In another aspect, embodiments of the present application further provide a display device. The display device includes the preceding display panel.

In the display panel and the display device provided in the present application, the display panel includes a first electrode and a second electrode, and the first electrode and the second electrode are both located on a same side of a light-emitting element close to a base substrate; the display panel includes a first reflective layer, the first reflective layer is located on a side of the light-emitting element facing the base substrate, that is, on a backlight side, and the first reflective layer covers the light-emitting element so that the light emitted by the light-emitting element to the backlight side may be reflected toward a light-emitting side, and thus the light-emitting efficiency of the display panel is improved. Based on this structure, the display panel further includes a voltage signal line located on a side of the light-emitting element facing the base substrate; the first electrode further includes a first extension part, and the second electrode further includes a second extension part; the first extension part and the second extension part are connected to the voltage signal line; the first electrode and the second electrode need to receive voltage signals from one side of the base substrate and provide the voltage signals for the light-emitting element, and the first reflective layer covers the light-emitting element. Therefore, to ensure the normal operation of the first electrode and the second electrode, the first extension part and the second extension part need to be provided, and at least one of the first extension part or the second extension part does not overlap the first reflective layer so that it is ensured that the first electrode and the second electrode normally receive the voltage signals, and the light-emitting efficiency of the display panel is improved.

DETAILED DESCRIPTION

Embodiments of the present disclosure are described below in conjunction with drawings and embodiments.

It is to be noted that details are set forth below to facilitate a thorough understanding of the present disclosure. However, the present disclosure may be implemented by various embodiments different from the embodiments described herein. Therefore, the present disclosure is not limited to the embodiments disclosed below.

Figure 1:
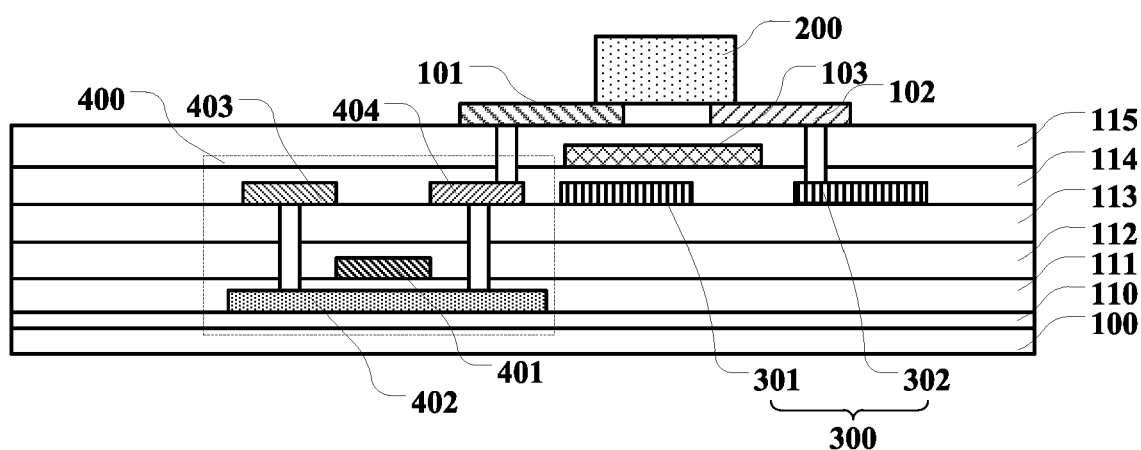
FIG. 1 is a partial schematic view of a display panel according to an embodiment of the present application.
Figure 2:
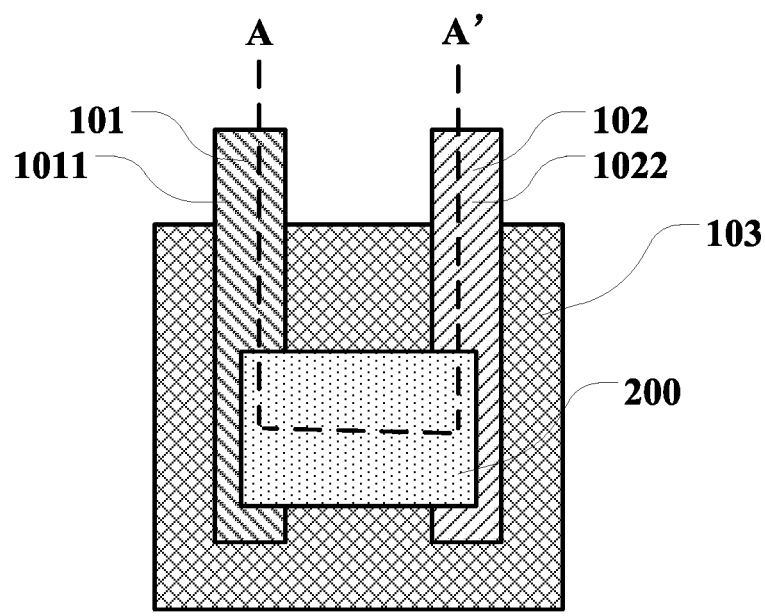
FIG. 2 is a top view of the display panel of FIG. 1.
Figure 3:
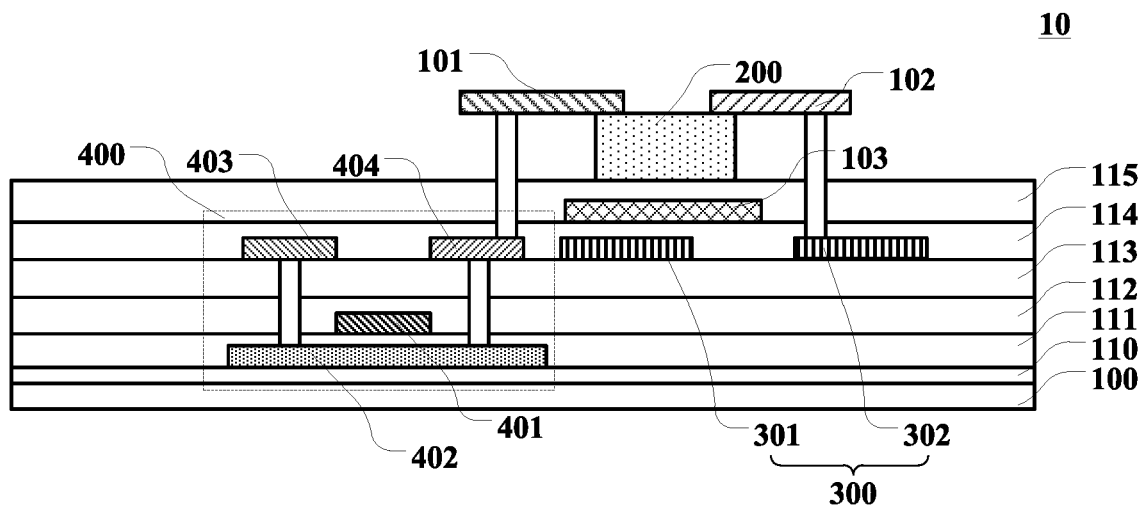
FIG. 3 is a partial schematic view of a display panel according to another embodiment of the present application.

In one aspect, embodiments of the present application provide a display panel. Referring to FIGS. 1 to 3, FIG. 1 is a partial schematic view of a display panel according to an embodiment of the present application, FIG. 2 is a top view of the display panel of FIG. 1, FIG. 1 is a sectional view taken along a direction AA' of FIG. 2, and FIG. 3 is a partial schematic view of a display panel according to another embodiment of the present application. A display panel 10 includes a base substrate 100, a light-emitting element 200, a first electrode 101 and a second electrode 102, a first reflective layer 103, and a voltage signal line 300. The light-emitting element 200 is located on the base substrate 100. The first electrode 101 and the second electrode 102 are electrically connected to the light-emitting element 200. Moreover, as shown in FIG. 1, the first electrode 101 and the second electrode 102 are both located on a side of the light-emitting element 200 facing the base substrate 100, or as shown in FIG. 3, the first electrode 101 and the second electrode 102 are both located on a side of the light-emitting element 200 facing away from the base substrate 100, and the first electrode 101 and the second electrode 102 provide voltage signals for the light-emitting element 200. The first reflective layer 103 is located on a side of the light-emitting element 200 facing the base substrate 100, and with a direction perpendicular to the base substrate 100 as a projection direction, the first reflective layer 103 covers the light-emitting element 200. The voltage signal line 300 is located on a side of the light-emitting element 200 facing the base substrate 100. The first electrode 101 includes a first extension part 1011, and the second electrode 102 includes a second extension part 1022. The first extension part 1011 and the second extension part 1022 are connected to the voltage signal line 300. With the direction perpendicular to the base substrate 100 as the projection direction, at least one of the first extension part 1011 or the second extension part 1022 does not overlap the first reflective layer 103.

In the present application, the light-emitting element 200 may be a micro LED light-emitting element, a nanorod light-emitting diode (nanorod LED) light-emitting element, or other types of LED light-emitting elements. The light-emitting element 200 may include a P-type region and an N-type region. The P-type region and the N-type region are electrically connected to respective voltage signal lines through electrodes, to control the light-emitting element to be ON or to be OFF. In the present application, the voltage signal line 300 is a generic term for the voltage signal line connected to the first electrode 101 and the voltage signal line connected to the second electrode 102. It does not mean that only one voltage signal line exists, and it does not mean that the first electrode 101 and the second electrode 102 are connected to a same voltage signal line. Each of the first electrode 101 and the second electrode 102 may be connected to a respective voltage signal line. The first electrode 101 is electrically connected to a respective voltage signal line through the first extension part 1011, and a connection manner there between may be a direct connection or an electrical connection through a via hole. The second electrode 102 is electrically connected to a respective voltage signal line through the second extension part 1022, and the connection manner there between may be a direct connection or an electrical connection through a via hole. As shown in FIGS. 1 and 3, the connection manners therein are all in a connection through a via hole.

It is to be noted that, as described above, the first reflective layer 103 covers the light-emitting element 200, which generally indicates that with the direction perpendicular to the base substrate 100 as the projection direction, the projection of the first reflective layer 103 covers the projection of the light-emitting element 200. Such coverage herein is generally referred as a full coverage, that is, the projected area of the first reflective layer 103 is greater than or equal to the projected area of the light-emitting element 200. In such a way, the first reflective layer 103 may reflect as much light as possible emitted by the light-emitting element 200 to the backlight side to a light-emitting side, so that the light-emitting efficiency is increased. However, in some special cases, the specific designs are considered, for example, a partial region, such as positions of some holes or the positions of some special structures both of which need to be avoided from being covered, of the light-emitting element 200 cannot be covered by the first reflective layer 103, which also falls within the scope of "coverage" defined by the present application. That is, the term "coverage", if no special cases exist, may refer to a full coverage, but if a special structural design exists, may also refer to an at least partial coverage.

In addition, the first reflective layer 103 in this embodiment mainly plays a role of reflecting light, and the material of the first reflective layer 103 may be a metal material such as silver, aluminum, titanium, or molybdenum, or may be an alloy material containing silver, aluminum, titanium, or molybdenum, or the material of the first reflective layer 103 may be a fluorescent material or other materials with a light-reflecting property, which is not limited in this embodiment.

Based on the preceding description, in the present application, at least one of the first extension part 1011 or the second extension part 1022 does not overlap the first reflective layer 103. On the one hand, the light-emitting efficiency of the display panel is improved. On the other aspect, the inventor of the present application found that the first extension part 1011 and the second extension part 1022 needs to be connected to the voltage signal line 300 on a side facing the base substrate, however as the first reflective layer 103 covers the light-emitting element 200, the first reflective layer 103 may block the connection between the first extension part 1011 and the voltage signal line 300 and may block the connection between the second extension part 1022 and the voltage signal line 300. Therefore, at least one of the first extension part 1011 and the second extension part 1022 is arranged to not overlap the first reflective layer 103, so that the introduction of the first reflective layer 103 can be prevented from affecting the voltage signal input on the first electrode 101 and the second electrode 102.

In an embodiment, as shown in FIG. 1, in this embodiment, the voltage signal line 300 includes a first voltage signal line 301 that provides a first voltage signal and a second voltage signal line 302 that provides a second voltage signal. The first electrode 101 receives the first voltage signal, the second electrode 102 receives the second voltage signal, and the voltage of the first voltage signal is higher than the voltage of the second voltage signal. The display panel includes a pixel circuit 400, and a pixel circuit 400 is connected to the first voltage signal line 301. In a light emission stage of the display panel, the first extension part 1011 receives the first voltage signal through a transistor of the pixel circuit 400; the second extension part 1022 is connected to the second voltage signal line 302 and is configured to receive the second voltage signal.

In one embodiment, the pixel circuit 400 may include a transistor. T transistor includes a gate 401, an active layer 402, a source 403, and a drain 404. A voltage signal is transmitted between the source 403 and the drain 404 in the case where the transistor is turned on. The pixel circuit 400 generally receives signals such as the first voltage signal, a data write signal, and a reset signal. Under the control of a gate drive signal and a light emission control signal, a drive current is selectively provided for the light-emitting element 200. The transistor in the pixel circuit 400 include a drive transistor and a switching transistor. The switching transistor is mainly responsible for selectively providing various signals for the drive transistor, and the drive transistor is mainly responsible for generating a drive current for the light-emitting element. The transistor of the pixel circuit 400 may be a silicon-based transistor such as a transistor formed with low-temperature polycrystalline silicon (LTPS) as an active layer and may also be an oxide semiconductor-based transistor, which is a transistor formed with an oxide semiconductor as an active layer such as an indium gallium zinc oxide (IGZO) type transistor. In some cases, at least one transistor in the pixel circuit 400 may be an LTPS type transistor, and at least one transistor may be an IGZO type transistor. In addition, as shown in FIG. 1, the display panel further includes insulating layers such as an insulating layer 110, an insulating layer 111, an insulating layer 112, an insulating layer 113, an insulating layer 114, an insulating layer 115, and so on. These insulating layers mainly isolate conductive layers to prevent the signal confusion caused by the mutual connection between the conductive layers. In a case where the upper conductive layers and the lower conductive layers need to be connected, via holes are disposed on the insulating layers to achieve electrical connection.

In this embodiment, the light-emitting element 200 may be a micro LED light-emitting element or a nanorod LED light-emitting element. The light-emitting element 200 includes a P-type region and an N-type region. The P-type region is connected to the first electrode 101 so that the first voltage signal is received, and the N-type region is connected to the second electrode 102 so that the second voltage signal is received. In one embodiment, the first voltage signal may be a high voltage signal, the second voltage signal may be a low voltage signal so that a potential difference is formed between the high voltage signal and the low voltage signal, and thus the LED emits light under the action of the potential difference. In this embodiment, the first voltage signal is selectively transmitted to the first electrode 301 through the pixel circuit 400, and the second voltage signal is transmitted to the second electrode 302 through an electrical connection so that a light-emitting brightness of the light-emitting element 200 may be controlled.

Based on the preceding setting, in this embodiment, at least the first extension part 101 and the first reflective layer 103 do not overlap. As described above, the first extension part 1011 is connected to the first voltage signal line 301 through the transistors in the pixel circuit 400, and the second extension part 1022 may be electrically connected to the second voltage signal line 302 through a via hole or directly connected to the second voltage signal line 302. However, as described above, each transistor in the pixel circuit 400 includes the gate 401, the active layer 402, the source 403, the drain 404, and insulating layers and often needs to occupy more film layers. Therefore, whether the first reflective layer 103 affects the connection between the first extension part and the transistor must be considered. To ensure the connection between the first extension part and the transistor, the first extension part 1011 is arranged to not overlap the first reflective layer 103, which is conducive to achieving a connection between the first extension part 1011 and the transistors in a region where the first extension part 1011 does not overlap the first reflective layer 103.

Figure 4:
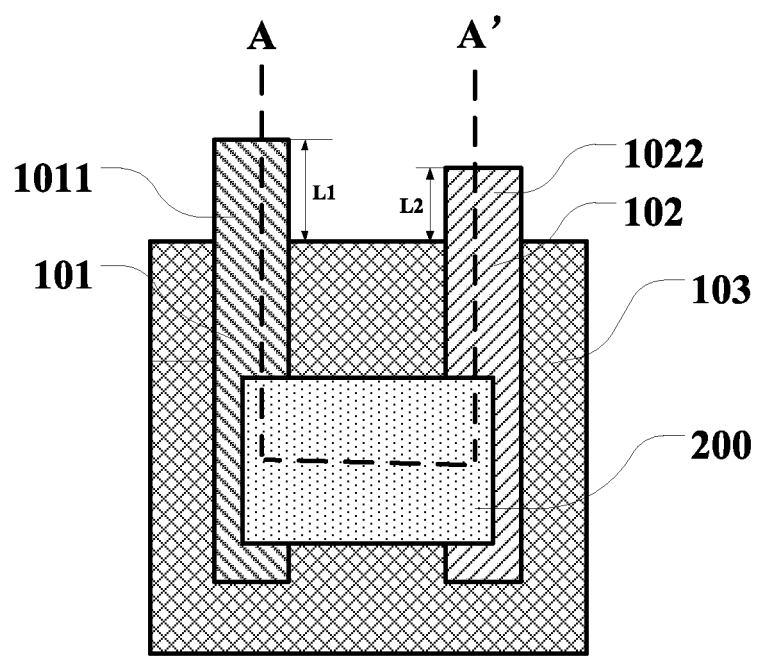
FIG. 4 is a partial top view of a display panel according to another embodiment of the present disclosure.

Referring to FIG. 4, FIG. 4 is a partial top view of a display panel according to another embodiment of the present disclosure. A length L1 of the first extension part 1011 is greater than a length L2 of the second extension part 1022. Herein, the length L1 of the first extension part 1011 and the length L2 of the second extension part 1022 generally refer to a length of the first extension part 1011 and a length of the second extension part 1022 relative to the extension direction of the light-emitting element 200. As described above, the first extension part 1011 is connected to the transistors of the pixel circuit 400, the transistors generally occupy more film layers, and both the film layers of the transistors and the film layer of the first reflective layer 103 are located on a side of the light-emitting element 200 facing the base substrate. Therefore, the influence of the first reflective layer 103 on the connection between the first extension part 1011 and the transistors must be considered. To ensure that the first reflective layer 103 fully plays the role of reflecting, the area of the first reflective layer 103 is generally greater than the area of the light-emitting element 200. Therefore, in this embodiment, the length of the first extension part 1011 may be appropriately set to be relatively longer so that the connection between the first extension part 1011 and the transistors is ensured, as long as the second extension part 1022 is electrically connected to the second voltage signal line 302. Generally speaking, the second voltage signal line 302 may be a conductive layer and may be located on a side of the first reflective layer 103 facing away from the base substrate, or may be located on a side of the first reflective layer 103 facing the base substrate, or may be located on a same layer as the first reflective layer 103. In particular, in a case where the second voltage signal line 302 is located on a side of the first reflective layer 103 facing away from the base substrate or on a same layer as the first reflective layer 103, the connection between the second extension part 1022 and the second voltage signal line 302 does not need to avoid the first reflective layer 103. Therefore, the second extension part 1022 may be set to be relatively shorter so that a panel space may be saved. In a case where the second voltage signal line 302 is located on a side of the first reflective layer 103 facing the base substrate, since the second voltage signal line 302 is generally a single conductive layer or may be double conductive layers, an adjustment of a position of the second voltage signal line 302 is relatively easy compared with an adjustment of multi-layered transistors. For example, the gate, the active layer, the source, the drain, and so on need to be considered for the adjustment of the film layers of the transistors, and changes in the size or relative position of the gate, the active layer, the source, the drain, and so on may possible cause changes in an aspect ratio, a threshold voltage, and other parameters of the transistor. To sum up, when saving the panel space is considered, the second extension part 1022 connected to the second voltage signal line 302 whose position may be relatively easily adjusted, may be appropriately set to be relatively shorter, and the length of the first extension part 1011 may be set to be relatively longer so that characteristics of respective connection structures may be better matched.

Figure 5:
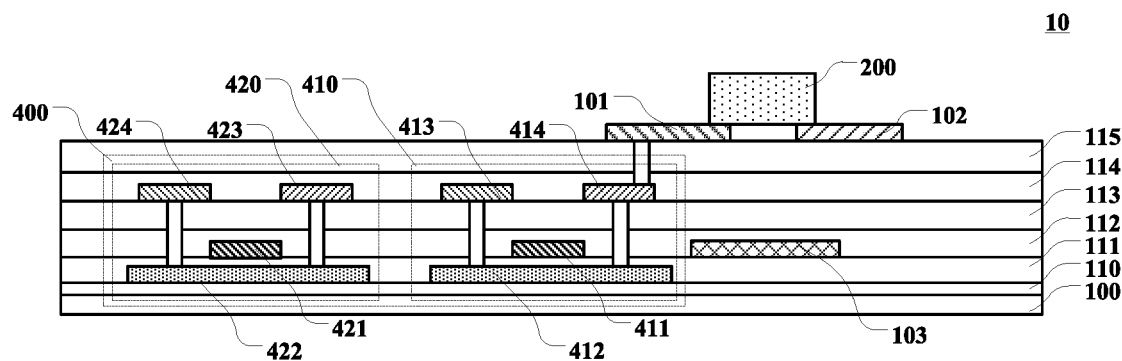
FIG. 5 is a partial schematic view of a display panel according to another embodiment of the present application.

Referring to FIG. 5, FIG. 5 is a partial schematic view of a display panel according to another embodiment of the present application. The pixel circuit 400 includes a first transistor 410 and a second transistor 420. The first transistor 410 includes a first gate 411, a first active layer 412, a first source 413, and a first drain 414. The second transistor 420 includes a second gate 421, a second active layer 422, a second source 423, and a second drain 424. The first extension part 1011 is connected to the first drain 414, and at least part of the structure of the first transistor 410 is located on a side of the first reflective layer 103 facing the base substrate 100. Since the first reflective layer 103 mainly plays the role of reflecting the light emitted by the light-emitting element 200 to the backlight side to the light-emitting side, to avoid light loss, the distance between the first reflective layer 103 and the light-emitting element 200 should not be too great. In a case where the distance is too far, the insulating layers in the middle absorb more in the light path where the light is reflected back and forth, resulting in more light loss, which affects the light-emitting efficiency. Therefore, generally speaking, at least part of the structure of the first transistor 410 is located on a side of the first reflective layer 103 facing the base substrate 100. In such a way, the first reflective layer 103 may be prevented from being too far away from the light-emitting element 200. Based on this structure, if the first extension part 1011 is connected to the first transistor 410, the first extension part 1011 and the first reflective layer 103 do not overlap so that the first reflective layer 103 may be prevented from affecting the connection between the first extension portion 1011 and the first transistor 410.

In an embodiment, referring to FIG. 5, in this embodiment, with the direction perpendicular to the base substrate 100 as the projection direction, both the first transistor 410 and the second transistor 420 do not overlap the first reflective layer 103, and the first reflective layer 103 and at least one of the first gate 411 or the second gate 421 are located on a same layer. In this case, since neither the first transistor 410 nor the second transistor 420 does not overlap the first reflective layer 103, the first reflective layer 103 needs to be located on a side of the light-emitting element 200 facing the base substrate 100, and the first gate 411 and the second gate 421 are generally made of metal materials, which are also reflective materials. Therefore, from the perspective of simplifying the process, the first reflective layer 103 is located on a same layer as the first gate 411 or the second gate 421. In particular, in a case where the material of the first reflective layer 103 is same as the material of the first gate 411 or the second gate 421, the first reflective layer 103 may be made of the same material in a same process with the first gate 411 or the second gate 421, to simplify the process, reducing the thickness of the display panel, and simplifying the overall structure.

Figure 6:
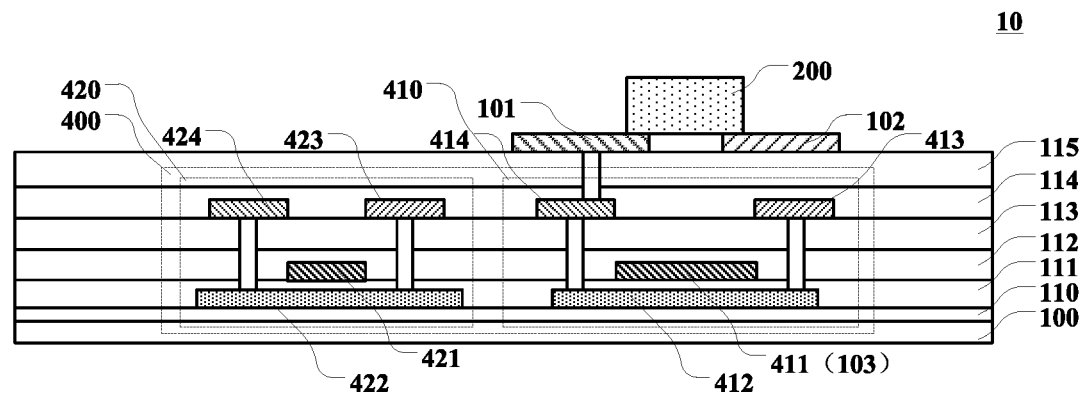
FIG. 6 is a partial schematic view of a display panel according to another embodiment of the present application.

In an embodiment, referring to FIG. 6, FIG. 6 is a partial schematic view of a display panel according to another embodiment of the present application. In the figure, with the direction perpendicular to the base substrate 100 as the projection direction, at least one of the first transistor 410 or the second transistor 420 and the light-emitting element 200 overlap, and at least one of the first gate 410 or the second gate 420 is multiplexed as the first reflective layer 103. In a case where the panel has a relatively high resolution requirement, a situation where the transistors in the pixel circuit 400 overlaps the light-emitting element 200 may exist. In this situation, the gate of the transistor that overlaps the light-emitting element 200 may be multiplexed as the first reflective layer 103. FIG. 6 shows a situation where the first transistor 410 overlaps the light-emitting element 200. In this situation, the first gate 411 is multiplexed as the first reflective layer 103; in a case where the second transistor 420 overlaps the light-emitting element 200, the second gate 421 is multiplexed as the first reflective layer 103. In such a way, on the one hand, the first gate 411 or the second gate 421 is used as a gate by using the electrical characteristic of the first gate 411 or the second gate 421; on the other hand, the first gate 411 or the second gate 421 is used as the first reflective layer 103 by using the reflective property of the metal material of which the first gate 411 or the second gate 421 is made so that the first gate 411 and the second gate 421 are fully utilized, which is conducive to simplifying the structure of the panel and achieving the high-resolution display.

Figure 7:
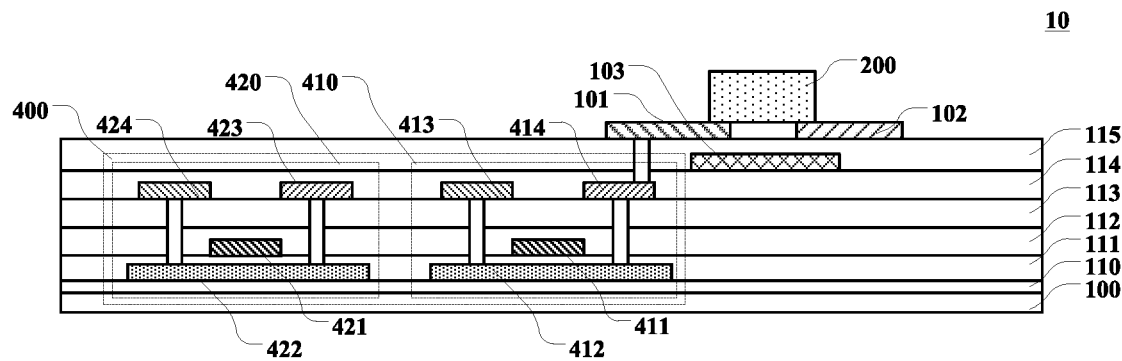
FIG. 7 is a partial schematic view of a display panel according to another embodiment of the present application.

In an embodiment, referring to FIG. 7, FIG. 7 is a partial schematic view of a display panel according to another embodiment of the present application. In the figure, the first reflective layer 103 is located on a side of the first gate 411 and the second gate 421 facing away from the base substrate. It is to be noted herein that both the first transistor 410 and the second transistor 420 may overlap the light-emitting element 200, or one of the first transistor 410 and the second transistor 420 may overlap the light-emitting element 200, or neither the first transistor 410 nor the second transistor 420 may overlap the light-emitting element 200. Herein, the first reflective layer 103 is disposed on a side of the first gate 411 and the second gate 421 facing away from the base substrate based on the role played by the first reflective layer 103 to reflect the light of the light-emitting element 200. In a case where the first reflective layer 103 is not located on a same layer as the first gate 411 and the second gate 421, to fully ensure the reflection effect of the first reflective layer 103, the first reflective layer 103 is disposed on the side of the first gate 411 and the second gate 421 facing away from the base substrate.

Figure 8:
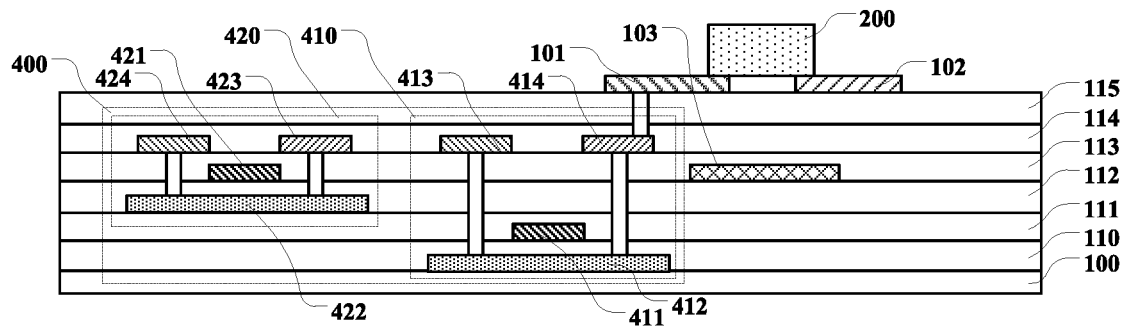
FIG. 8 is a partial schematic view of a display panel according to another embodiment of the present application.
Figure 9:
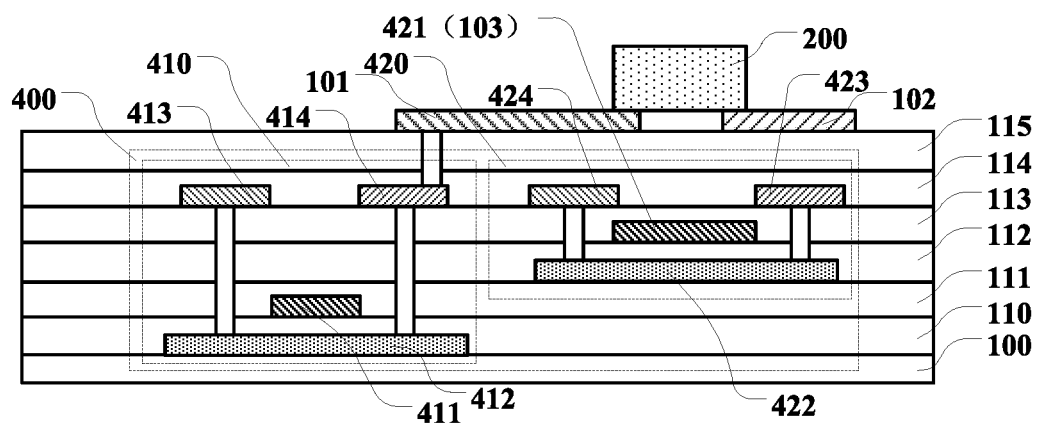
FIG. 9 is a partial schematic view of a display panel according to another embodiment of the present application.

In an embodiment, referring to FIGS. 8 and 9, FIG. 8 is a partial schematic view of a display panel according to another embodiment of the present application, and FIG. 9 is a partial schematic view of a display panel according to another embodiment of the present application. The first active layer 412 includes silicon, the second active layer 422 includes an oxide semiconductor, the second active layer 422 is located on a side of the first active layer 412 facing away from the base substrate 100, and the second gate 421 is located on a side of the second active layer 422 facing away from the base substrate 100. As shown in FIG. 8, the first reflective layer 103 and the second gate 421 are located on the same layer, or as shown in FIG. 9, the second gate 421 is multiplexed as the first reflective layer 103. Since the LTPS type transistor has advantages such as a strong driving ability and relatively high stability, the LTPS type transistor may be used as a drive transistor or a switching transistor in the pixel circuit. The IGZO type transistor has advantages such as a small leakage current and may be applied to an important switching transistor so that the leakage current is reduced. Therefore, the pixel circuit 400 may include both LTPS type transistors and IGZO type transistors. In this case, generally speaking, the active layer of the IGZO type transistor is more sensitive to hydrogen elements, and after the LTPS type active layer is formed, the IGZO type active layer is manufactured. Therefore, the second active layer 422 is located on a side of the first active layer 412 facing away from the base substrate 100, and the IGZO type active layer is generally manufactured as a top-gate structure or a top-bottom double-gate structure. As described above, in the case where the first reflective layer 103 is relatively close to the light-emitting element 200, the first reflective layer 103 has a better reflection effect. Therefore, in conjunction with the light-emitting efficiency and simplifying the panel process, the first reflective layer 103 and the second gate 421 are disposed on a same layer, or the second gate 421 is multiplexed as the first reflective layer 103, and the material of the first reflective layer 103 may be same as the material of the second gate 421. In some embodiments, the material of the first reflective layer 103 may be different from the material of the second gate 421.

Figure 10:
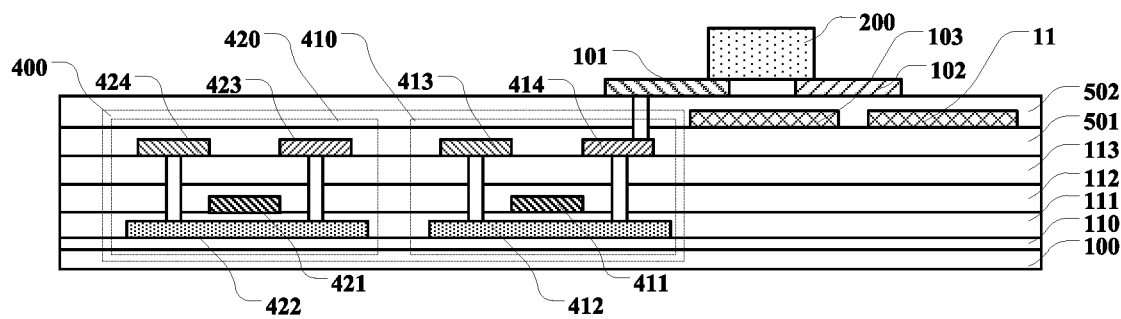
FIG. 10 is a partial schematic view of a display panel according to another embodiment of the present application.

Referring to FIG. 10, FIG. 10 is a partial schematic view of a display panel according to another embodiment of the present application. In the figure, the display panel 10 includes a first metal layer 11, and the first metal layer 11 is located on a side of any one of the first source 413, the first drain 414, the second source 423, or the second drain 424 facing away from the base substrate 100, where the first reflective layer 103 is located on the first metal layer 11.

In this case, the display panel may include a first planarization layer 501 and a second planarization layer 502 located on a side of any one of the first source 413, the first drain 414, the second source 423, or the second drain 424 facing away from the base substrate 100. The first metal layer 11 is at least located on a side of the first planarization layer 501 facing away from the base substrate 100. Part of wires on the first metal layer 11 may be connected to the first voltage signal line 301 in parallel so that a voltage drop on the first voltage signal line 301 is reduced. In one embodiment, the first voltage signal line 301 may be located on the first metal layer 11, since the first metal layer 11 has fewer wires, the first voltage signal line 301 may be set to be relatively wide so that the voltage drop thereon is reduced. The first reflective layer 103 is located on the first metal layer 11, and since the first reflective layer 103 is located on a side of any one of the first source 413, the first drain 414, the second source 423, or the second drain 424 facing away from the base substrate 100, the first reflective layer 103 is relatively closer to the light-emitting element 200, therefore the light efficiency loss is less, which is conducive to improve the light-emitting efficiency.

Figure 11:
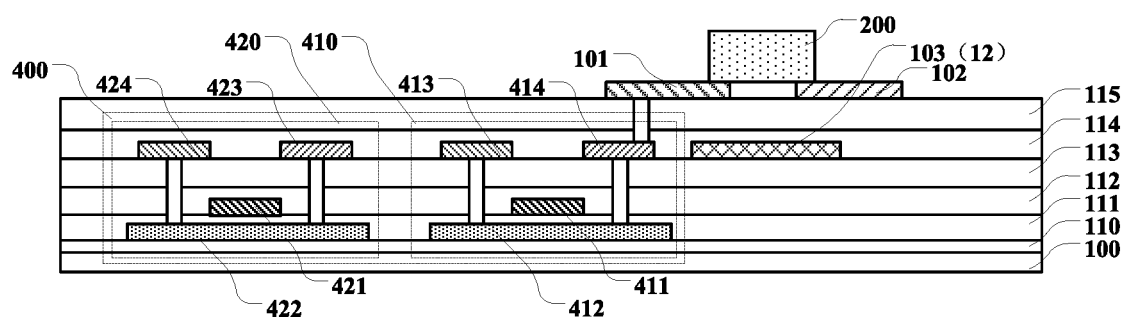
FIG. 11 is a partial schematic view of a display panel according to another embodiment of the present application.

Referring to FIG. 11, FIG. 11 is a partial schematic view of a display panel according to another embodiment of the present application. The display panel 10 includes a second metal layer 12, the second metal layer 12 is located on a same layer as the first source 413 and/or the first drain 414, or the second metal layer 12 is located on a same layer as the second source 423 and/or the second drain 424, where the first reflective layer 103 is located on the second metal layer 12.

Figure 12:
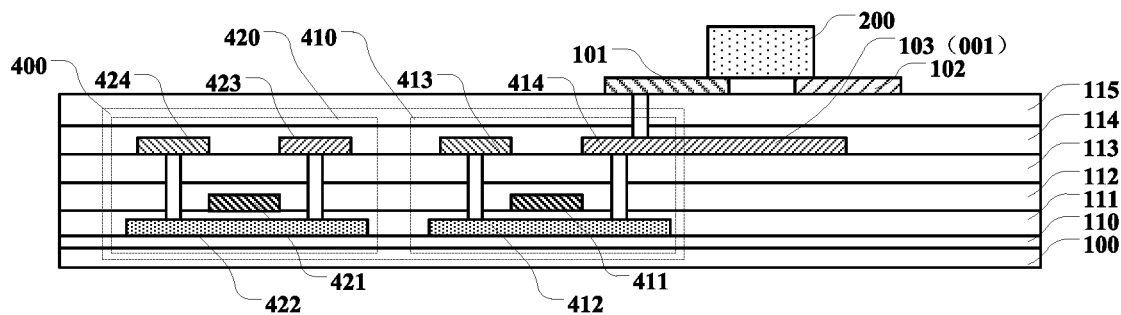
FIG. 12 is a partial schematic view of a display panel according to another embodiment of the present application.

Referring to FIG. 12, FIG. 12 is a partial schematic view of a display panel according to another embodiment of the present application. In the figure, at least one of the first source 413, the first drain 414, the second source 423, or the second drain 424 includes a first region 001, the first region 001 extends and overlaps the light-emitting element 200, and the first region 001 is multiplexed as the first reflective layer 103.

In the preceding two cases, the first reflective layer 103 is disposed on the same layer as at least one of the first source 413, the first drain 414, the second source 423, or the second drain 424, or a first region of 001 of at least one of the first source 413, the first drain 414, the second source 423, or the second drain 424 is multiplexed as the first reflective layer 103. Generally speaking, as the source and the drain are located on a side of an entire structure of the transistor facing away from the base substrate, the source and the drain are relatively closer to the light-emitting element 200, the first reflective layer 103 is disposed on this layer, so that a process for the first reflective layer 103 can be completed at a same layer with the manufacturing of the source and the drain, so that the process is simplified. In addition, as the first reflective layer 103 is relatively closer to the light-emitting element 200, the light efficiency loss is reduced, which is conducive to improving the light-emitting efficiency. In particular, as shown in FIG. 12, in a case where a first region 001 of the first drain 414 connected to the first extension part 1011 is multiplexed as the first reflective layer, the first extension part 1011 is also connected to the first reflective layer 103, so that the problem of avoidance there between does not need to be considered, achieving a simple. It is to be noted that, in this case, at least part region of the second extension part 1022 does not overlap the first reflective layer 103.

Figure 13:
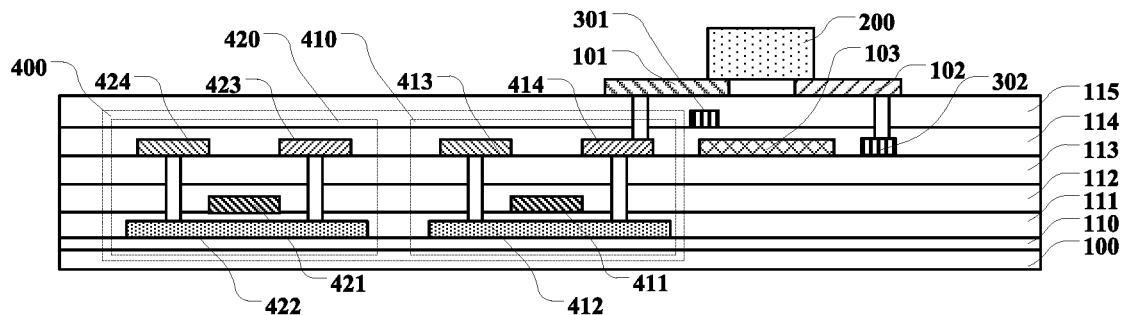
FIG. 13 is a partial schematic view of a display panel according to another embodiment of the present application.
Figure 14:
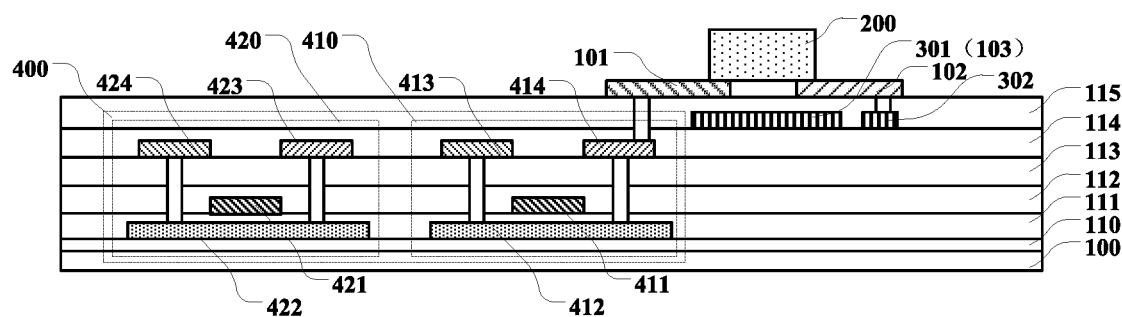
FIG. 14 is a partial schematic view of a display panel according to another embodiment of the present application.

Referring to FIGS. 13 and 14, FIG. 13 is a partial schematic view of a display panel according to another embodiment of the present application, and FIG. 14 is a partial schematic view of a display panel according to another embodiment of the present application. The first voltage signal line 301 and the second voltage signal line 302 are located on a side of at least one of the first electrode 101 or the second electrode 102 facing the base substrate 100. As shown in FIG. 13, the first reflective layer 103 is located on the same layer as at least one of the first voltage signal line 301 or the second voltage signal line 302. In one embodiment, as shown in FIG. 14, at least one of the first voltage signal line 301 or the second voltage signal line 302 is multiplexed as the first reflective layer 103. FIG. 13 illustrates a case where the first reflective layer 103 and the second voltage signal line 302 are located on the same layer. In some other embodiments, the first reflective layer 103 may also be located on the same layer as the first voltage signal line 301. In FIG. 14, the first voltage signal line 301 is multiplexed as the first reflective layer 103. In other embodiments, the second voltage signal line 302 may also be multiplexed as the first reflective layer 103. In conjunction with the preceding description, the first voltage signal line 301 and the second voltage signal line 302 may be located on the first metal layer 11 or on the second metal layer 12. The first voltage signal line 301 and the second voltage signal line 302 may be located on a same layer or on different layers. For example, the first voltage signal line 301 is located on the first metal layer 11, the second voltage signal line 302 is located on the second metal layer 12; or the first voltage signal line 301 is located on the second metal layer 12, and the second voltage signal line 302 is located on the first metal layer 11.

Since the first voltage signal line 301 and the second voltage signal line 302 need to provide signals for the first electrode 101 and the second electrode 102, the first voltage signal line 301 and the second voltage signal line 302 are generally set to be relatively closer to the light-emitting element 200, and the first reflective layer 103 is disposed on a same layer as at least one of the first voltage signal line 301 or the second voltage signal line 302. In such a way, the manufacturing of the first reflective layer 103 and at least one of the first voltage signal line 301 or the second voltage signal line 302 can be completed through a same mask, and thus the process is simplified while the light-emitting efficiency of the panel is ensured. In addition, the first voltage signal line 301 and the second voltage signal line 302 are generally connected to the drive elements in the panel. Generally, the signals on the first voltage signal and the second voltage signal need to be accurate. However, after the drive elements extending to the inside of the panel, when the first voltage signal line 301 and the second voltage signal line 302 is far away from the drive elements, the voltage drops on the first voltage signal line 301 and the second voltage signal line 302 are more significant. Therefore, to avoid the voltage drop, the width of the first voltage signal line 301 and the width of the second voltage signal line 302 are generally set to be relatively wider so that the voltage drop is reduced. In this case, relying on the relatively wide first voltage signal line 301 or second voltage signal line 302 being set to be relatively wider, at least one of the first voltage signal line 301 or the second voltage signal line 302 is multiplexed as the first reflective layer 103. In such a way, on the one hand, a relatively small voltage drops on the first voltage signal line 301 and the second voltage signal line 302 is ensured; and on the other hand, an existing structure of the panel is fully utilized as the first reflective layer 103 so that the process is simplified, and the cost is saved.

Figure 15:
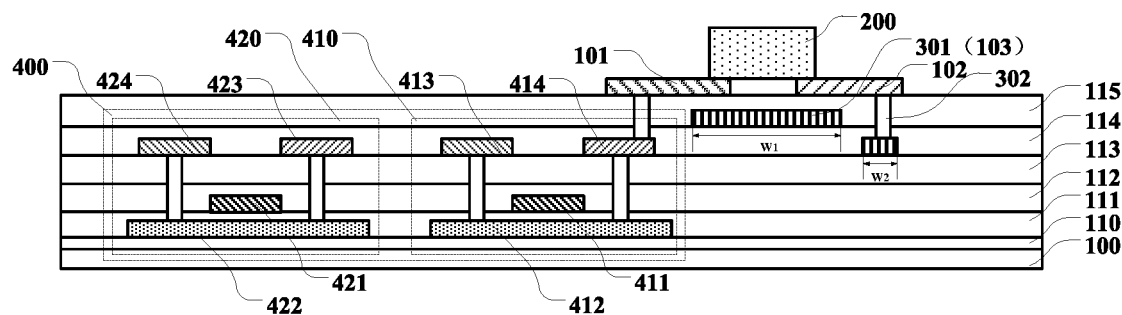
FIG. 15 is a partial schematic view of a display panel according to another embodiment of the present application.

Referring to FIGS. 14 and 15, FIG. 15 is a partial schematic view of a display panel according to another embodiment of the present application. As shown in FIG. 15, the first voltage signal line 301 is located on a side of the second voltage signal line 302 facing away from the base substrate 100; or as shown in FIG. 14, the first voltage signal line 301 and the second voltage signal line 302 are located on a same layer, where at least the first voltage signal line 301 is multiplexed as the first reflective layer 103.

Referring to FIG. 15, the width W1 of the first voltage signal line 301 is greater than the width W2 of the second voltage signal line 302, where the first voltage signal line 301 is multiplexed as the first reflective layer 103. It is to be noted herein that the width W1 and the width W2 generally refer to a width in directions perpendicular to the extension directions of corresponding voltage signal lines and parallel to the plane where the base substrate 100 is located. The first voltage signal line 301 and the second voltage signal line 302 may extend in a same direction or may extend in different directions.

The first voltage signal line 301 is configured to provide the first voltage signal for the pixel circuit 400, and the first voltage signal is a high voltage signal, which is a crucial factor in a calculation formula of the drive current received by the light-emitting element 200. To ensure that the drive current is as accurate as possible, the first voltage signal needs to be as accurate as possible. Therefore, generally, the first voltage signal line 301 may be set to be relatively wider in the panel, and the first voltage signal line 301 may be disposed on the first metal layer 11. Since the first metal layer 11 is on a side of the film layers of the transistors facing away from the base substrate and the first metal layer 11 has fewer wires, the first voltage signal line 301 may be set to be relatively wider. In conjunction with these aspects, at least the first voltage signal line is multiplexed as the first reflective layer 103 so that the panel structure is simplified, and the light-emitting efficiency of the panel is ensured.

Figure 16:
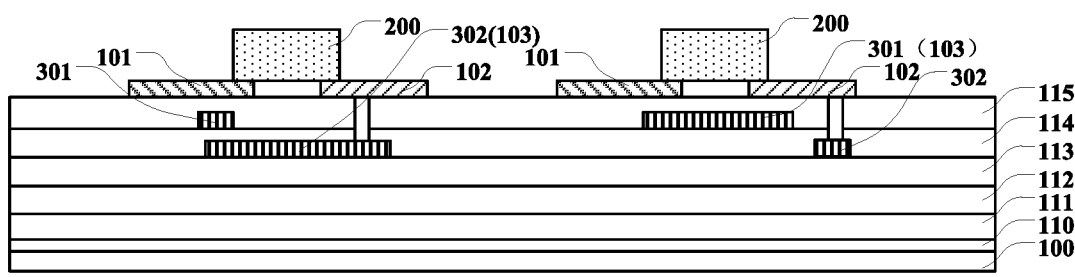
FIG. 16 is a partial schematic view of a display panel according to another embodiment of the present application.

Referring to FIG. 16, FIG. 16 is a partial schematic view of a display panel according to another embodiment of the present application. In the figure, the first voltage signal line 301 is multiplexed as the first reflective layer 103 corresponding to at least one light-emitting element 200, and the second voltage signal line 302 is multiplexed as the first reflective layer 103 corresponding to at least one light-emitting element 200. In a case where a special case exists in the panel, the width of the first voltage signal line 301 is limited, and the case where the first voltage signal line 301 is multiplexed as the first reflective layer 103 corresponding to all the light-emitting elements 200 is limited; it is also feasible that the first voltage signal line 301 is multiplexed as the first reflective layer 103 corresponding to part of the light-emitting elements 200, and the second voltage signal line 302 is multiplexed as the first reflective layer 103 corresponding to part of the light-emitting elements 200.

Referring to FIGS. 14 to 16, in this embodiment, in the case where the first voltage signal line 301 is multiplexed as the first reflective layer 103, the second extension part 1022 does not overlap the first reflective layer 103; or in the case where the second voltage signal line 302 is multiplexed as the first reflective layer 103, the first extension part 1011 and the first reflective layer 103 do not overlap. For example, in the case where the first voltage signal line 301 is multiplexed as the first reflective layer 103, the second extension part 1022 needs to be connected to the second voltage signal line 302. To ensure that the connection is unimpeded, the second extension part 1022 does not overlap the first reflective layer 103. In the case where the second voltage signal line 302 is multiplexed as the first reflective layer 103, the first extension part 1011 needs to be connected to the first voltage signal line 301. To ensure that the connection is unimpeded, the first extension part 1011 and the first reflective layers 103 do not overlap.

Figure 17:
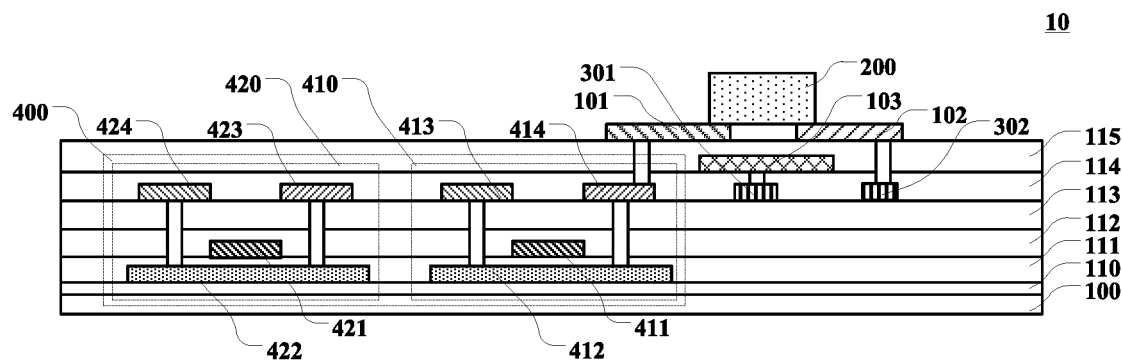
FIG. 17 is a partial schematic view of a display panel according to another embodiment of the present application.

Referring to FIG. 17, FIG. 17 is a partial schematic view of a display panel according to another embodiment of the present application. The first reflective layer 103 is connected to the first voltage signal line 301 in parallel so that the first voltage signal is received, or the first reflective layer 103 is connected to the second voltage signal line 302 in parallel so that the second voltage signal is received. FIG. 17 illustrates a case where the first reflective layer 103 is connected to the first voltage signal line 301 in parallel. In other embodiments, the first reflective layer 103 may be connected to the second voltage signal line 302 in parallel. As described above, the voltage drops on the first voltage signal line 301 and the second voltage signal line 302 need to be relatively small, hence the first reflective layer 103 may be connected to the first voltage signal line 301 or to the second voltage signal line 302 in parallel so that the voltage drops on the first voltage signal line 301 and the second voltage signal line 302 are reduced.

With continued reference to FIG. 17, the first reflective layer 103 is located on a side of both the first voltage signal line 301 and the second voltage signal line 302 facing away from the base substrate 100. Since the first reflective layer 103 is relatively close to the light-emitting element 200, the light loss therein is reduced, which is conducive to improving the light-emitting efficiency of the display panel. Therefore, in a case where the first reflective layer 103 is not located in a same layer as the first voltage signal line 301 or the second voltage signal line 302, the first reflective layer 103 may be located on a side of the first voltage signal line 301 and the second voltage signal line 302 facing away from the base substrate 100 so that the light-emitting efficiency of the display panel is improved.

Figure 18:
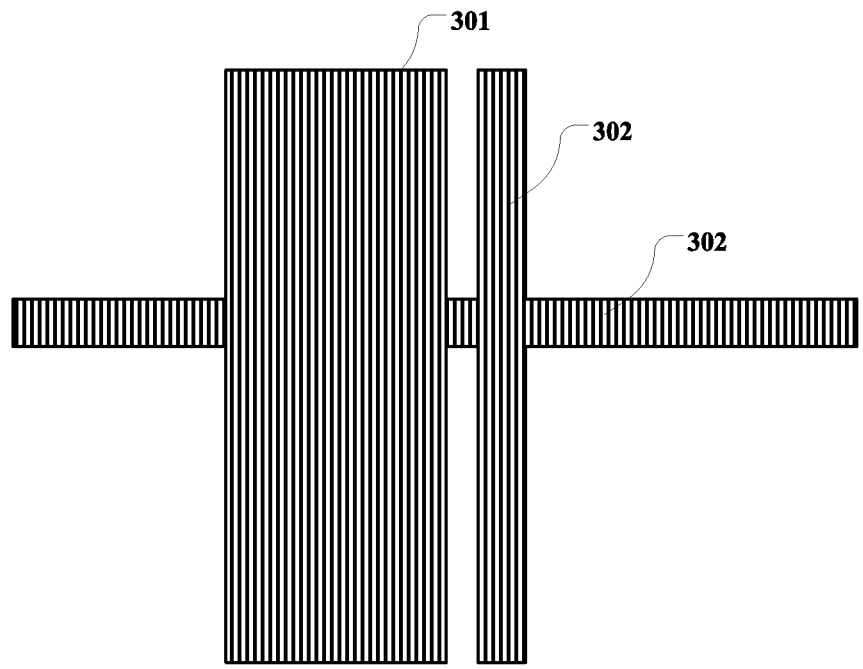
FIG. 18 is a top view of voltage signal lines according to an embodiment of the present application.

Referring to FIG. 18, FIG. 18 is a top view of voltage signal lines according to an embodiment of the present application. First voltage signal lines 301 and second voltage signal lines 302 may extend in the same direction. In this case, a first voltage signal bus that introduces multiple first voltage signal lines 301 may be located on the same side of the display panel as a second voltage signal bus that introduces multiple second voltage signal lines 302, and the first voltage signal lines 301 and the second voltage signal lines 302 may be located on a same film layer. In other embodiments, the extension direction of each first voltage signal line 301 may be perpendicular to the extension direction of each second voltage signal line 302. In this case, the first voltage signal line 301 and the second voltage signal line 302 may be located on different layers, and the first voltage signal line 301 is disposed on a side of the second voltage signal line 302 facing away from the base substrate so that the width of the first voltage signal line 301 may be set to be wider than the width of the second voltage signal line 302. In other embodiments, the first voltage signal lines 301 may extend in one direction, and the second voltage signal lines 302 may extend in two directions to form a grid structure, where part of the second voltage signal lines 302 are parallel to the first voltage signal lines 301, and another part of the second voltage signal lines 302 are perpendicular to the first voltage signal lines 301. In other embodiments, it is also feasible that the first voltage signal lines 301 may extend in two directions, and the second voltage signal lines 302 may extend in one direction, where part of the first voltage signal lines 301 are parallel to the second voltage signal lines 302, and part of the first voltage signal lines 301 are perpendicular to the second voltage signal lines 302. The specific structures depend on specific cases, which is not limited in this embodiment.

Figure 19:
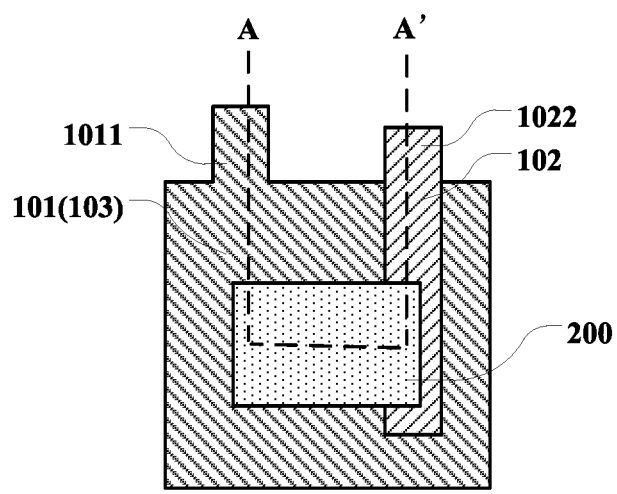
FIG. 19 is a partial schematic view of a display panel according to another embodiment of the present application.

Referring to FIG. 19, FIG. 19 is a partial schematic view of a display panel according to another embodiment of the present application. In the figure, the first electrode 101 and the second electrode 102 are both located on a side of the light-emitting element 200 facing the base substrate 100, at least one of the first electrode 101 or the second electrode 102 is multiplexed as the first reflective layer 103, and the extension part of the one of the first electrode 101 or the second electrode 102 multiplexed as the first reflective layer 103 does not overlap the extension part of the other one of the first electrode 101 or the second electrode 102. FIG. 19 illustrates a case where the first electrode 101 is multiplexed as the first reflective layer 103. In other embodiments, the second electrode 102 may be multiplexed as the first reflective layer 103.

The first electrode 101 or the second electrode 102 is multiplexed as the first reflective layer 103. In such a way, on the one hand, the first electrode 101 and the second electrode 102 are very close to the light-emitting element 200, and the multiplex herein would cause the light loss between the light-emitting element 200 and the first reflective layers 103 to be relatively less, so that the light-emitting efficiency of the display panel is improved; and meanwhile, an additional film layer does not need to be provided as the first reflective layer 103 so that the panel process is simplified. It is to be noted that to ensure the fully reflection effect of the first reflective layer 103, the area of the first reflective layer 103 is generally greater than the area of the light-emitting element 200. Therefore, generally speaking, one of the first electrode 101 or the second electrode 102 closer to a side of the base substrate 100 is multiplexed as the first reflective layer 103 so that both the first electrode 101 and the second electrode 102 may be connected to the light-emitting element 200, and the reflection effect of the first reflective layer 103 is ensured. FIG. 19 illustrates a case where the first electrode 101 is located on a side of the second electrode 102 facing the base substrate 100 and is multiplexed as the first reflective layer 103. In other embodiments, the second electrode 102 is located on a side of the first electrode 101 facing the base substrate 100 and is multiplexed as the first reflective layer.

Figure 20:
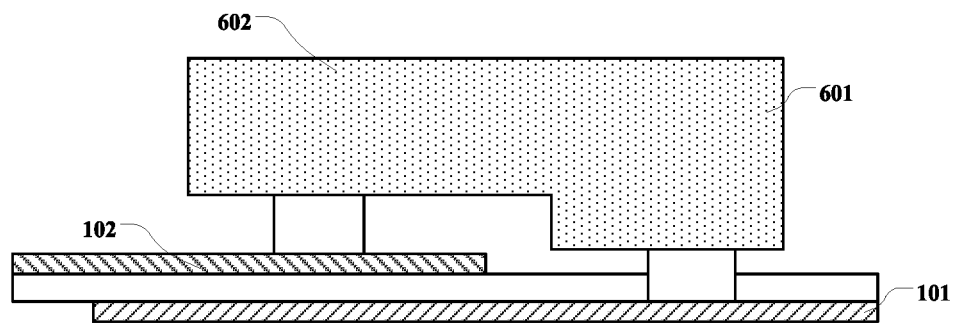
FIG. 20 is a schematic diagram of a light-emitting element according to an embodiment of the present disclosure.

Referring to FIGS. 19 and 20, FIG. 20 is a schematic diagram of a light-emitting element according to an embodiment of the present disclosure. In an embodiment, the first electrode 101 is located on a side of the second electrode 102 facing the base substrate 100, the first electrode 101 is multiplexed as the first reflective layer 103, and the second extension part 1022 does not overlap the first reflective layer 103. Since the first electrode 101 is connected to the P-type region 601 of the light-emitting element 200, and the second electrode 102 is connected to the N-type region 602 of the light-emitting element 200; generally, a height of the P-type region 601 is greater than a height of the N-type region 602, and a height difference between the P-type region and the N-type region exists. In this case, the first electrode 101 is arranged to be located on a side of the second electrode 102 facing the base substrate, so that structural characteristics of the light-emitting element 200 are matched. The second extension part 1022 is located on a side of the first electrode 101 facing away from the base substrate, and to ensure a normal connection between the second extension part 1022 and the second voltage signal line 302, the second extension part 1022 does not overlap the first reflective layer 103.

Figure 21:
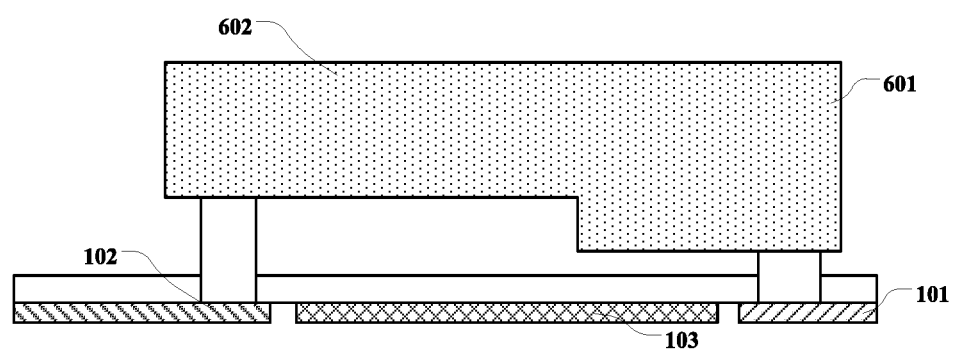
FIG. 21 is a schematic diagram of another light-emitting element according to an embodiment of the present disclosure.
Figure 22:
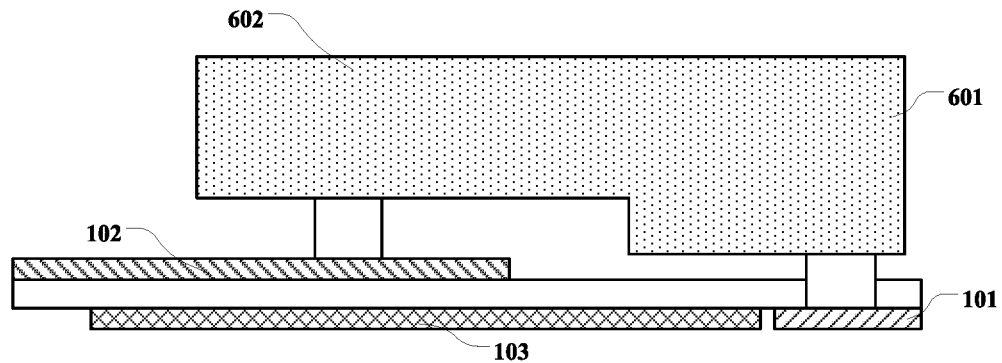
FIG. 22 is a schematic diagram of another light-emitting element according to an embodiment of the present disclosure.

Referring to FIGS. 21 and 22, FIG. 21 is a schematic diagram of another light-emitting element according to an embodiment of the present disclosure, and FIG. 22 is a schematic diagram of another light-emitting element according to an embodiment of the present disclosure. As shown in FIG. 21, the first reflective layer 103 is located on the same layer as at least one of the first electrode 101 or the second electrode 102; or as shown in FIG. 22, the first reflective layer 103 is located on the same layer as one of the first electrode 101 or the second electrode 102 closer to a side of the base substrate 100. The first reflective layer 103 may be located on a same layer as the first electrode 101 or the second electrode 102, and the reflective layer 103 may not be electrically connected to the first electrode 101 or the second electrode 102. In such an arrangement, since the first reflective layer 103 is relatively closer to the light-emitting element 200, the light-emitting efficiency can be ensured; in addition, the first reflective layer 103 is prepared by a same process as the first electrode 101 or the second electrode 102, so that the process is fully simplified, and the panel structure is simplified.

Figure 23:
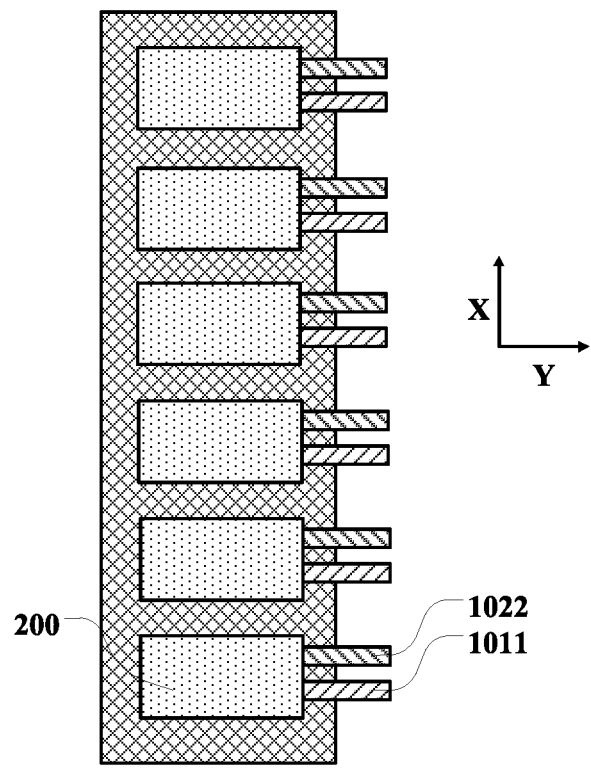
FIG. 23 is a partial top view of a display panel according to another embodiment of the present disclosure.
Figure 24:
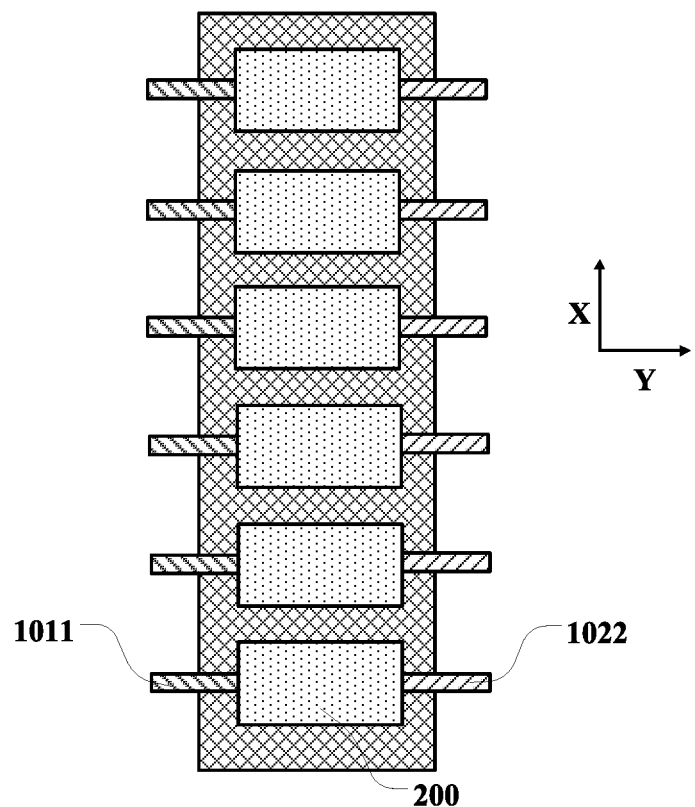
FIG. 24 is a partial top view of a display panel according to another embodiment of the present disclosure.

Referring to FIGS. 23 and 24, FIG. 23 is a partial top view of a display panel according to another embodiment of the present disclosure, and FIG. 24 is a partial top view of a display panel according to another embodiment of the present disclosure. The first reflection layer 103 extends along a first direction X, and the first extension part 1011 and/or the second extension part 1022 extend along a second direction Y, where the first direction X and the second direction Y are perpendicular to each other and are both parallel to the plane where the base substrate 100 is located. As shown in FIG. 23, the first extension part 1011 and the second extension part 1022 are located on a same side surface of the light-emitting element 200, while as shown in FIG. 24, the first extension part 1011 and the second extension part 1022 are located on opposite sides of the light-emitting element 200. In such an arrangement, the extension directions of the first extension part 1011 and the extension directions of the second extension part 1022 may be staggered with the extension direction of the first reflective layer 103, which is conducive to the electrical connection between the first extension part 1011 and a respective voltage signal line and to the electrical connection between the electrical connection between the second extension part 1022 and a respective voltage signal line.

It is to be noted that, what is shown in both FIGS. 23 and 24 is that, the first reflective layers 103 corresponding to the light-emitting elements 200 in a same column are all connected together, to simplifying a structure of the mask. However, in some special cases, different light-emitting elements 200 in the same column may also be disconnected from each other so that other designs may be made in gaps between adjacent light-emitting elements 200, and thus the influence on the first reflective layer 103 is avoided.

Figure 25:
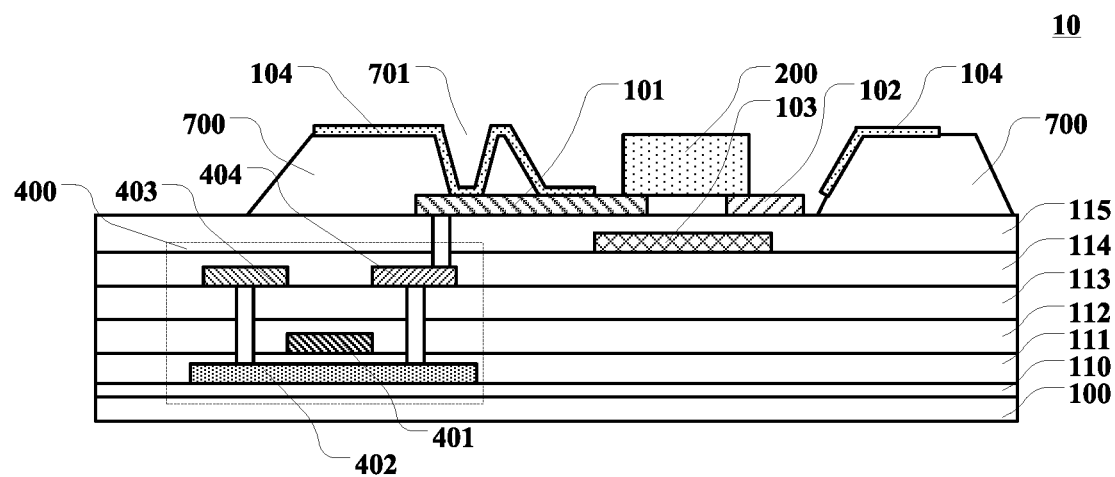
FIG. 25 is a partial schematic view of a display panel according to another embodiment of the present application.

Referring to FIG. 25, FIG. 25 is a partial schematic view of a display panel according to another embodiment of the present application. The display panel 10 further includes a barrier layer 700 and a second reflective layer 104. The barrier layer 700 is located between adjacent light-emitting elements 200. The second reflective layer 104 is located on a side of the barrier layer 700 facing away from the base substrate 100, and at least part of the second reflective layer 104 is located on a side wall of the barrier layer 700 facing the light-emitting element 200. It is to be noted that the barrier layer 700 here is a structure that is disposed between adjacent light-emitting elements 700 to block light crosstalk between adjacent light-emitting elements 700, and a color of the barrier layer 700 may be transparent or black. A material of the second reflective layer 104 may be a metal material such as silver, aluminum, titanium, or molybdenum, or an alloy material containing silver, aluminum, titanium, or molybdenum, or the material of the second reflective layer 104 may be a fluorescent material with a reflective property.

As light emitted by the light-emitting element 200 is emitted in various directions, and is emitted not only to the backlight side, but also to a surrounding region in the lateral direction, leading to the light loss. In this embodiment, the second reflective layer 104 is disposed on the side wall of the barrier layer 700, so that the light emitted by the light-emitting element 200 to the surrounding region may be reflected toward the light-emitting side, the side light is fully utilized, and the light-emitting efficiency is further improved.

In an embodiment, as shown in FIG. 25, the second reflective layer 104 is electrically connected to the first electrode 101, or the second reflective layer 104 is electrically connected to the second electrode 102. In FIG. 25, the second reflective layer 104 is electrically connected to the first electrode 101. In other embodiments, the second reflective layer 104 may also be electrically connected to the second electrode 102. Since the second reflective layer is disposed above the barrier layer 700, in a case where the second metal layer is a conductive material such as a metal material and is separately disposed in the air, since the second metal layer is relatively close to the light-emitting element 200, more static electricity may gather on the second reflective layer as time goes by, and the accumulation of the static electricity may cause damage to the light-emitting element 200. Therefore, in this embodiment, the second reflective layer 104 may be electrically connected to the first electrode 101 that is applied with a high voltage signal or the second electrode 102 that is applied with a low voltage signal so that the second reflective layer 104 may be maintained at a same potential as the first electrode 101 or the second electrode 102, and thus the static electricity is prevented from being accumulated on the second reflective layer 104 and affecting the display effect.

As shown in FIG. 25, in an embodiment, the second reflective layer 104 extends along the side wall of the barrier layer 700 to contact the first electrode 101 or the second electrode 102, and to electrically connect to the first electrode 101 or the second electrode 102. FIG. 25 exemplarily illustrates a case where the second reflective layer 104 is in direct contact with the first electrode 101. Since at least part region of the first reflective layer 104 is disposed on the side wall of the barrier layer 700, the first reflective layer 104 is directly connected to the first electrode 101 after being extended so that the process is simplified, and the structure is simple.

With continued reference to FIG. 25, in an embodiment, the barrier layer 700 may further include a first groove 701. With the direction perpendicular to the base substrate 100 as the projection direction, the first groove 701 overlaps the first electrode 101 or the second electrode 102, and the second reflective layer 104 extends into the first groove 701 and is electrically connected to the first electrode 101 or the second electrode 102. In some cases, in a case where the second reflective layer 104 directly extends along the side wall of the barrier layer 700 to be connected to the first electrode 101 or the second electrode 102, the following problem may exist: after the second reflective layer 104 contacts the first electrode 101, a distance between the second reflective layer 104 and the second electrode 102 is too close, and the second reflective layer 104 short-circuits the first electrode 101 and the second electrode 102. To avoid this problem, the first groove 701 is disposed on the barrier layer 700, and the second reflective layer 104 is connected to the first electrode 101 or the second electrode 102 through the first groove 701, so that the problem that the distance between the second reflective layer 104 and the other electrode is relatively close, and two electrodes are short-circuited is avoided.

Figure 26:
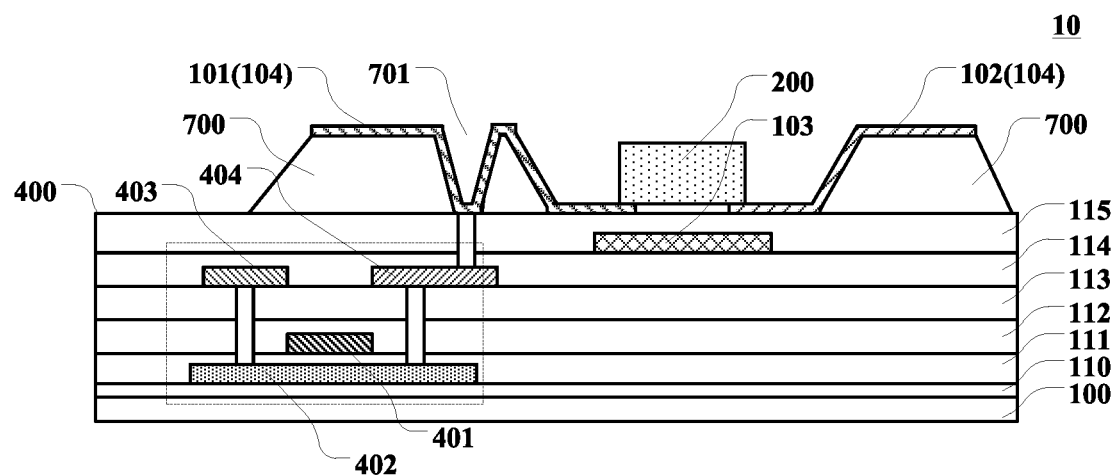
FIG. 26 is a partial schematic view of a display panel according to another embodiment of the present application.

Referring to FIG. 26, FIG. 26 is a partial schematic view of a display panel according to another embodiment of the present application. The first electrode 101 extends to the side wall of the barrier layer 700 facing the light-emitting element 200 and is multiplexed as the second reflective layer 104, and/or the second electrode 102 extends to the side wall of the barrier layer 700 facing the light-emitting element 200 and is multiplexed as the second reflective layer 104. FIG. 26 illustrates a case where both the first electrode 101 and the second electrode 102 are multiplexed as the second reflective layer 104. In other embodiments, only one of the first electrode 101 or the second electrode 102 may be arranged to be multiplexed as the second reflective layer 104. As described above, in a case where the second reflective layer 104 is a conductive material, the second reflective layer 104 needs to be electrically connected to the first electrode 101 or the second electrode 102, so that the second reflective layer 104 is prevented from floating in the air. From the perspective of simplifying the process, the first electrode 101 or the second electrode 102 may be multiplexed as the second reflective layer 104. In such a way, the second reflective layer 104 is formed while the first electrode 101 or the second electrode 102 is manufactured, so that the panel structure is fully simplified while the light-emitting efficiency is improved.

Figure 27:
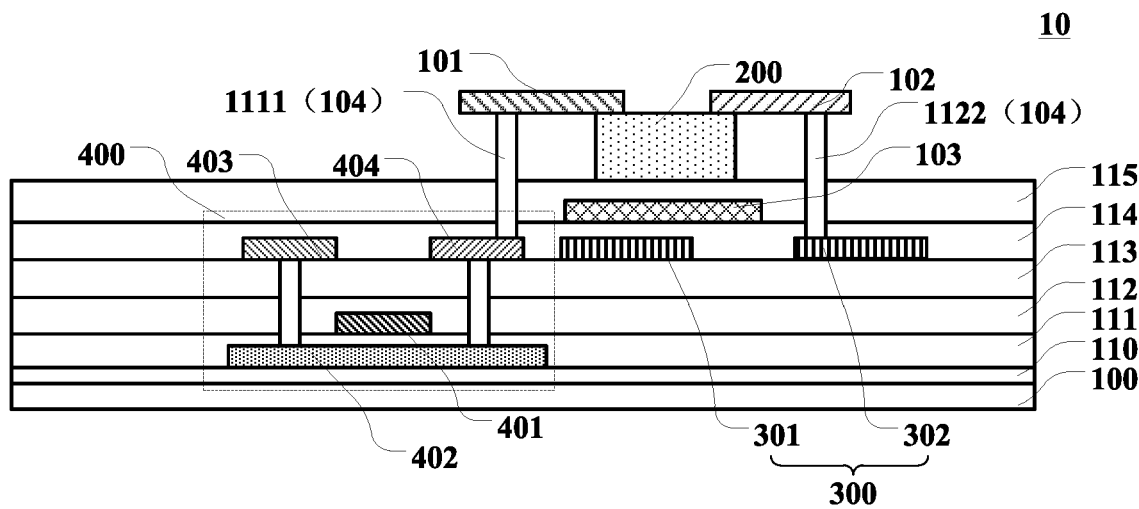
FIG. 27 is a partial schematic view of a display panel according to another embodiment of the present application.

Referring to FIG. 27, FIG. 27 is a partial schematic view of a display panel according to another embodiment of the present application. In the figure, the first electrode 101 and the second electrode 102 are both located on a side of the light-emitting element 200 facing away from the base substrate 100, the first electrode 101 is connected to the pixel circuit 400 through a first connection electrode 1111, and the second electrode 102 is connected to the second voltage signal line 302 through a second connection electrode 1122, where at least one of the first connection electrode 1111 or the second connection electrode 1122 is multiplexed as the second reflective layer 104. In a case where the first electrode 101 and the second electrode 102 are both located on a side of the light-emitting element 200 facing away from the base substrate 100, to ensure that the first electrode 101 and the second electrode 102 are connected to respective voltage signal lines, the first connection electrode 1111 and the second connection electrode 1112 may be arranged to extend from a side of the light-emitting element 200 facing away from the base substrate to a side of the light-emitting element 200 facing the base substrate. Based on this, the first connection electrode 1111 and the second connection electrode 1122 are generally conductive materials. Therefore, at least one of the first connection electrode 1111 or the second connection electrode 1122 may be multiplexed as the second reflective layer 104, so that the second reflective layer 104 is formed by using the existing structure, and the panel process is fully simplified.

Figure 28:
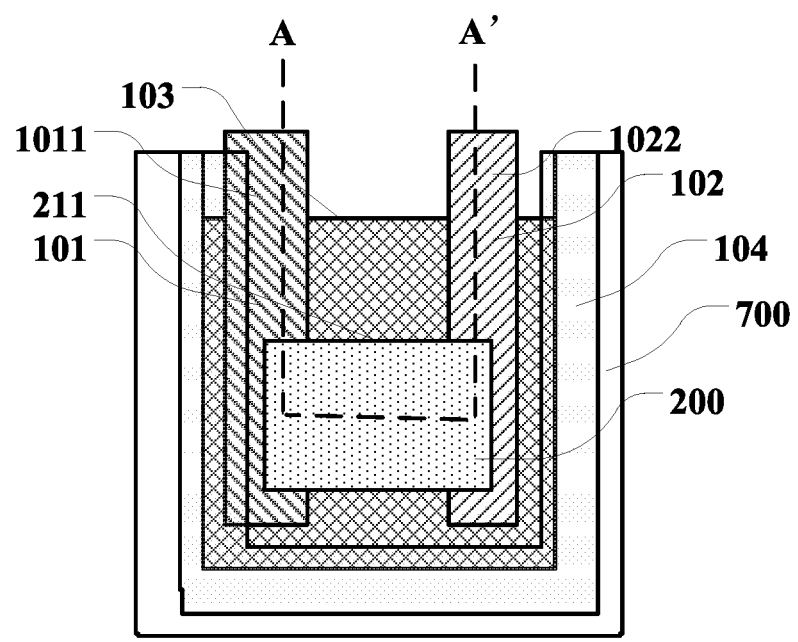
FIG. 28 is a partial top view of a display panel according to another embodiment of the present disclosure.

Referring to FIG. 28, FIG. 28 is a partial top view of a display panel according to another embodiment of the present disclosure. In the figure, the second reflective layer 104 is disposed around the light-emitting element 200, the first extension part 1011 and the second extension part 1022 extend along the second direction Y, and at least one of two side surfaces of the light-emitting element 200 arranged along the second direction Y is not provided with the second reflective layer 104.

This design is mainly because the second reflective layer 104 is generally connected to one of the first electrode 101 or the second electrode 102. In a case where the second reflective layer 104 is connected to one of the first electrode 101 or the second electrode 102, the second reflective layer 104 is not allowed to be connected to the other one of the first electrode 101 or the second electrode 102, otherwise the first electrode 101 and the second electrode 102 are short-circuited. In order to connect to the voltage signal lines, the first extension part 1011 and the second extension part 1022 are generally designed to be relatively longer. For example, in a case where the first electrode 101 and the second reflective layer 104 are connected, and the second reflective layer 104 is close to the second extension part 1022, short circuit is easy to occur. Therefore, in the present application, at least one of the two side surfaces of the light-emitting element 200 arranged along the second direction Y is not provided with the second reflective layer 104, so that the following problem is avoided: an extension part of one electrode that is not connected to the second reflective layer 104 contacts the second reflective layer, and short circuit between the first electrode 101 and the second electrode 102 occurs.

With continued reference to FIG. 28, the two side surfaces of the light-emitting element 200 arranged along the second direction Y include a first side surface 211, the first extension part 1011 and the second extension part 1022 are both located on the first side surface 211, and the first side surface is not provided with the second reflective layer 104. In this case, on the one hand, the first extension part 1011 and the second extension part 1022 are located on a same side of the light-emitting element, which is conducive to a rational space utilization of the panel and improve the resolution of the panel. On the other hand, as described above, the first side surface is not provided with the second reflective layer so that the following case is avoided: an extension part of one electrode that is not connected to the second reflective layer 104 contacts the second reflective layer 104, and short circuit between the first electrode 101 and the second electrode 102 occurs.

Figure 29:
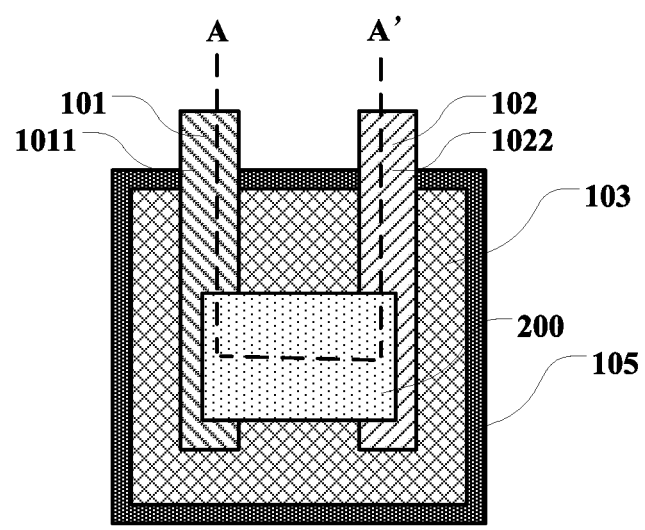
FIG. 29 is a partial schematic view of a display panel according to another embodiment of the present application.
Figure 30:
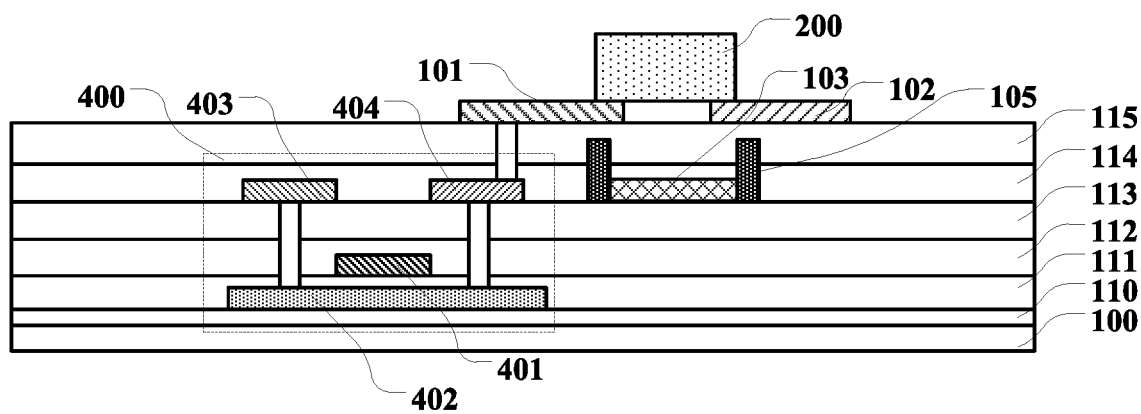
FIG. 30 is a partial schematic view of a display panel according to another embodiment of the present application.

Referring to FIGS. 29 and 30, FIG. 29 is a partial schematic view of a display panel according to another embodiment of the present application, and FIG. 30 is a partial schematic view of a display panel according to another embodiment of the present application. The display panel 10 further includes a third reflective layer 105, the third reflective layer 105 is located between at least one of the first electrode 101 or the second electrode 102 and the first reflective layer 103, and the third reflective layer 105 is at least partially disposed around the first reflective layer 103.

Further, as shown in FIG. 30, along the direction perpendicular to the base substrate 100, a height of the third reflective layer 105 is greater than a height of the first reflective layer 103.

In the preceding design, the following is mainly considered: the first reflective layer 103 is located below the light-emitting element 200; after the light emitted obliquely downward from the light-emitting element 200 is reflected by the first reflective layer 103, the light is reflected to the upper right and is possibly emitted in a non-luminous region between adjacent light-emitting elements 200 according to the reflection principle, causing a problem of color mixing. To avoid this problem, the third reflective layer 105 is set to have a height greater than the height of the first reflective layer 103, and is set to be disposed around the first reflective layer. In such a way, the light emitted obliquely downward from the light-emitting element 200 may be reflected again to the light-emitting side corresponding to the light-emitting element 200, so that the light-emitting effect of the display panel is further improved, and the phenomenon of color mixing of the display panel is avoided.

Figure 31:
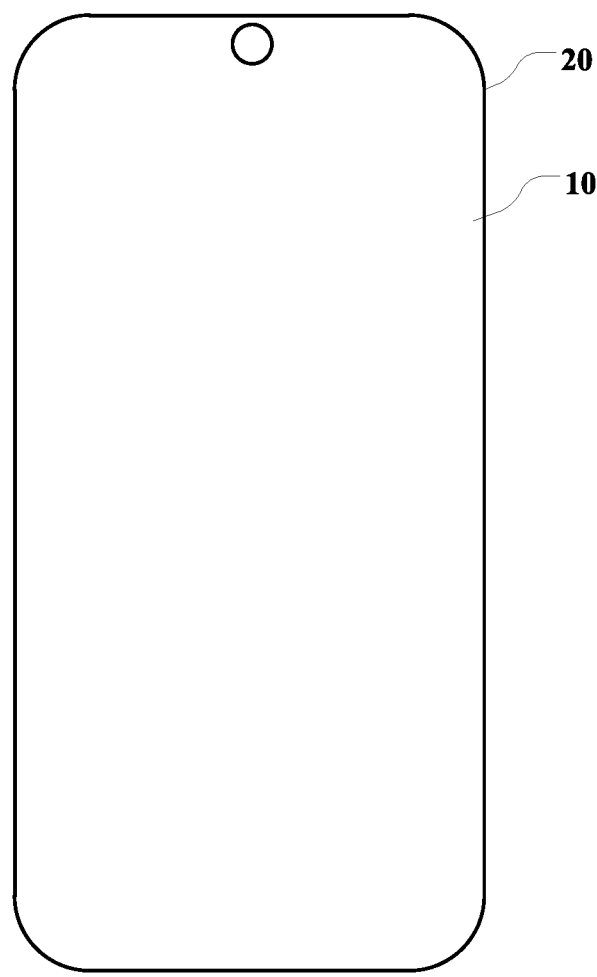
FIG. 31 is a schematic diagram of a display device according to an embodiment of the present application.

Another aspect of embodiments of the present application provides a display device. Referring to FIG. 31, FIG. 31 is a schematic diagram of a display device according to an embodiment of the present application. A display device 20 includes the display panel 10, and the display panel 10 includes all display panels described in the preceding embodiments. The display device 20 may be one of a variety of display devices such as a TV, a notebook, a mobile phone, and a smart wearable display device, which is not limited in this embodiment.

In the preceding description, embodiments of the present application provide the display panel 10 and the display device 20. The display panel 10 includes the first electrode 101 and the second electrode 102, and the first electrode 101 and the second electrode 102 are both located on the same side of the light-emitting element 200 relative to the base substrate 100; the display panel 10 includes the first reflective layer 103, the first reflective layer 103 is located on a side of the light-emitting element 200 facing the base substrate 100, that is, on the backlight side, and the first reflective layer 103 covers the light-emitting element 200 so that the light emitted by the light-emitting element 200 to the backlight side may be reflected toward the light-emitting side, and thus the light-emitting efficiency of the display panel is improved. Based on this structure, the display panel 10 further includes the voltage signal line 300 located on a side of the light-emitting element 200 facing the base substrate; the first electrode 101 further includes the first extension part 1011, and the second electrode 102 further includes the second extension part 1022; the first extension part 1011 and the second extension part 1022 are connected to the voltage signal line 300; the first electrode 101 and the second electrode 102 need to receive voltage signals from one side of the base substrate 100 and provide the voltage signals for the light-emitting element 200, and the first reflective layer 103 covers the light-emitting element 200. Therefore, to ensure the normal operation of the first electrode 101 and the second electrode 102, the first extension part 1011 and the second extension part 1022 need to be provided, and at least one of the first extension part 1011 or the second extension part 1022 does not overlap the first reflective layer 103 so that it is ensured that the first electrode 101 and the second electrode 102 normally receive the voltage signals, and the light-emitting efficiency of the display panel is improved.

What is claimed is:

1. A display panel, comprising:
   a base substrate;
   a light-emitting element, wherein the light-emitting element is located on the base substrate;
   a first electrode and a second electrode, wherein the first electrode and the second electrode are electrically connected to the light-emitting element, are both located on a side of the light-emitting element facing the base substrate or both located on a side of the light-emitting element facing away from the base substrate, and provide voltage signals for the light-emitting element;
   a first reflective layer, wherein the first reflective layer is located on a side of the light-emitting element facing the base substrate, and with a direction perpendicular to the base substrate as a projection direction, the first reflective layer covers the light-emitting element; and
   a voltage signal line, wherein the voltage signal line is located on a side of the light-emitting element facing the base substrate,
   wherein the first electrode comprises a first extension part, the second electrode comprises a second extension part, at least one of the first extension part or the second extension part is connected to the voltage signal line, and with the direction perpendicular to the base substrate as the projection direction, at least one of the first extension part or the second extension part does not overlap the first reflective layer;
   wherein the display panel comprises a pixel circuit, the pixel circuit comprises a first transistor and a second transistor, the first transistor comprises a first gate, a first active layer, a first source, and a first drain, and the second transistor comprises a second gate, a second active layer, a second source, and a second drain;
   wherein the display panel comprises a first metal layer, wherein the first metal layer is located on a side of any one of the first source, the first drain, the second source, or the second drain facing away from the base substrate, and
   wherein the first reflective layer is located on the first metal layer.

2. The display panel of claim 1, wherein the voltage signal line comprises a first voltage signal line that provides a first voltage signal and a second voltage signal line that provides a second voltage signal, wherein the first electrode receives the first voltage signal, the second electrode receives the second voltage signal, and a voltage of the first voltage signal is higher than a voltage of the second voltage signal,
   wherein the pixel circuit is connected to the first voltage signal line, and in a light emission stage of the display panel, the first extension part receives the first voltage signal through transistors of the pixel circuit; and
   wherein the second extension part is connected to the second voltage signal line and is configured to receive the second voltage signal.

3. The display panel of claim 2, wherein at least the first extension part does not overlap the first reflective layer.

4. The display panel of claim 2, wherein a length of the first extension part is greater than a length of the second extension part.

5. The display panel of claim 2, wherein the first extension part is connected to the first drain, and at least part of a structure of the first transistor is located on a side of the first reflective layer facing the base substrate.

6. The display panel of claim 2, wherein the first reflective layer is located on a side of both the first voltage signal line and the second voltage signal line facing away from the base substrate.

7. A display device, comprising the display panel of claim 1.

8. A display panel, comprising:
   a base substrate:
   a light-emitting element, wherein the light-emitting element is located on the base substrate;
   a first electrode and a second electrode, wherein the first electrode and the second electrode are electrically connected to the light-emitting element, are both located on a side of the light-emitting element facing the base substrate or both located on a side of the light-emitting element facing away from the base substrate, and provide voltage signals for the light-emitting element;
a first reflective layer, wherein the first reflective layer is located on a side of the light-emitting element facing the base substrate, and with a direction perpendicular to the base substrate as a projection direction, the first reflective layer covers the light-emitting element; and
a voltage signal line, wherein the voltage signal line is located on a side of the light-emitting element facing the base substrate,
wherein the first electrode comprises a first extension part, the second electrode comprises a second extension part, at least one of the first extension part or the second extension part is connected to the voltage signal line, and with the direction perpendicular to the base substrate as the projection direction, at least one of the first extension part or the second extension part does not overlap the first reflective layer;
wherein the voltage signal line comprises a first voltage signal line that provides a first voltage signal and a second voltage signal line that provides a second voltage signal;
wherein the first voltage signal line and the second voltage signal line are located on a side of at least one of the first electrode or the second electrode facing the base substrate,
wherein the first reflective layer is located on a same layer as at least one of the first voltage signal line or the second voltage signal line; or
at least one of the first voltage signal line or the second voltage signal line is multiplexed as the first reflective layer.

9. The display panel of claim 8, wherein the first voltage signal line is multiplexed as the first reflective layer corresponding to at least one light-emitting element, and the second voltage signal line is multiplexed as the first reflective layer corresponding to at least one light-emitting element.

10. A display panel, comprising:
a base substrate;
a light-emitting element, wherein the light-emitting element is located on the base substrate;
a first electrode and a second electrode, wherein the first electrode and the second electrode are electrically connected to the light-emitting element, are both located on a side of the light-emitting element facing the base substrate or both located on a side of the light-emitting element facing away from the base substrate, and provide voltage signals for the light-emitting element;
a first reflective layer, wherein the first reflective layer is located on a side of the light-emitting element facing the base substrate, and with a direction perpendicular to the base substrate as a projection direction, the first reflective layer covers the light-emitting element; and
a voltage signal line, wherein the voltage signal line is located on a side of the light-emitting element facing the base substrate,
wherein the first electrode comprises a first extension part, the second electrode comprises a second extension part, at least one of the first extension part or the second extension part is connected to the voltage signal line, and with the direction perpendicular to the base substrate as the projection direction, at least one of the first extension part or the second extension part does not overlap the first reflective layer; and
wherein the first electrode and the second electrode are both located on a side of the light-emitting element facing the base substrate, at least one of the first electrode or the second electrode is multiplexed as the first reflective layer, and an extension part of one of the first electrode or the second electrode that is multiplexed as the first reflective layer and an extension part of the other one of the first electrode or the second electrode do not overlap.

11. A display device, comprising the display panel of claim 8.

12. A display device, comprising the display panel of claim 10.

* * * * *